United States Patent
Basol

(10) Patent No.: US 7,485,561 B2
(45) Date of Patent: Feb. 3, 2009

(54) FILLING DEEP FEATURES WITH CONDUCTORS IN SEMICONDUCTOR MANUFACTURING

(75) Inventor: Bulent M. Basol, Manhattan Beach, CA (US)

(73) Assignee: ASM NuTool, Inc., Phoenix, AZ (US)

( * ) Notice: Subject to any disclaimer, the term of this patent is extended or adjusted under 35 U.S.C. 154(b) by 28 days.

(21) Appl. No.: 11/394,064

(22) Filed: Mar. 29, 2006

(65) Prior Publication Data

US 2007/0238293 A1    Oct. 11, 2007

(51) Int. Cl.
*H01L 21/44* (2006.01)
(52) U.S. Cl. .................. 438/610; 438/184; 438/238; 438/678; 257/E23.166
(58) Field of Classification Search ............ 438/184, 438/678, 238, 610; 257/E23.166
See application file for complete search history.

(56) References Cited

U.S. PATENT DOCUMENTS

| | | | |
|---|---|---|---|
| 4,808,273 A | 2/1989 | Hua | |
| 4,978,639 A | 12/1990 | Hua | |
| 5,998,292 A | 12/1999 | Black et al. | |
| 6,013,948 A | 1/2000 | Akram | |
| 6,176,992 B1 | 1/2001 | Talieh | |
| 6,268,660 B1 | 7/2001 | Dhong et al. | |
| 6,270,389 B1 * | 8/2001 | Kobayashi et al. | 445/24 |
| 6,270,647 B1 | 8/2001 | Graham et al. | |
| 6,277,740 B1 * | 8/2001 | Goldstein | 438/660 |
| 6,319,384 B1 | 11/2001 | Taylor et al. | |
| 6,319,831 B1 | 11/2001 | Tsai et al. | |
| 6,333,248 B1 | 12/2001 | Kishimoto | |
| 6,346,479 B1 | 2/2002 | Woo et al. | |
| 6,413,388 B1 | 7/2002 | Uzoh | |
| 6,433,402 B1 | 8/2002 | Woo et al. | |
| 6,458,696 B1 | 10/2002 | Gross | |
| 6,482,656 B1 | 11/2002 | Lopatin | |
| 6,492,260 B1 | 12/2002 | Kim et al. | |
| 6,534,116 B2 | 3/2003 | Basol | |
| 6,548,395 B1 | 4/2003 | Woo et al. | |

(Continued)

FOREIGN PATENT DOCUMENTS

EP    1167585    1/2002

(Continued)

OTHER PUBLICATIONS

Reid et al., "Factors influencing damascene feature fill using copper PVD and electroplating." *Solid State Technology*, Jul. 2000, pp. 86-103.

(Continued)

*Primary Examiner*—George Fourson
*Assistant Examiner*—John M Parker
(74) *Attorney, Agent, or Firm*—Knobbe Martens Olson & Bear LLP

(57) ABSTRACT

A method of filling a conductive material in a three dimensional integration structure feature formed on a surface of a wafer is disclosed. The feature is filled with a dispersion containing a plurality of conductive particles and a solvent. Then, the solvent is removed from the feature, leaving the plurality of conductive particles in the feature. These two steps are repeated until the feature is filled up with the conductive particles. Then, the conductive particles are annealed in the feature, thereby forming a dense conductive plug in the feature.

21 Claims, 3 Drawing Sheets

U.S. PATENT DOCUMENTS

| | | |
|---|---|---|
| 6,566,259 B1 | 5/2003 | Ding et al. |
| 6,599,778 B2 | 7/2003 | Pogge |
| 6,620,725 B1 | 9/2003 | Shue et al. |
| 6,709,970 B1 | 3/2004 | Park et al. |
| 6,750,144 B2 | 6/2004 | Taylor |
| 6,762,076 B2 | 7/2004 | Kim |
| 6,846,725 B2 | 1/2005 | Nagarajan |
| 6,852,627 B2 | 2/2005 | Sinha |
| 6,856,025 B2 | 2/2005 | Pogge |
| 6,887,795 B2 | 5/2005 | Soininen |
| 6,897,148 B2 | 5/2005 | Halahan |
| 6,924,224 B2 | 8/2005 | Egitto |
| 6,965,045 B2 | 11/2005 | Jung |
| 6,975,016 B2 | 12/2005 | Keller et al. |
| 7,019,402 B2 | 3/2006 | Andry |
| 7,067,407 B2 | 6/2006 | Kostamo |
| 7,098,061 B2 | 8/2006 | Sirringhaus et al. |
| 7,148,565 B2 | 12/2006 | Kim et al. |
| 2003/0015435 A1 | 1/2003 | Volodarsky et al. |
| 2003/0038038 A1 | 2/2003 | Basol et al. |
| 2003/0089986 A1 | 5/2003 | Gilkes et al. |
| 2003/0119311 A1 | 6/2003 | Basol et al. |
| 2004/0012090 A1 | 1/2004 | Basol et al. |
| 2005/0014317 A1* | 1/2005 | Pyo .......................... 438/184 |
| 2006/0003566 A1 | 1/2006 | Emesh |
| 2006/0139407 A1* | 6/2006 | Umeda et al. ................ 347/54 |
| 2006/0223301 A1 | 10/2006 | Vanhaelemeersch et al. |

FOREIGN PATENT DOCUMENTS

| | | |
|---|---|---|
| JP | 11165253 | 6/1999 |
| JP | 2000208443 | 7/2000 |
| WO | WO 01/32362 | 5/2001 |
| WO | WO 01/78135 | 10/2001 |
| WO | WO 03/009361 | 1/2003 |

OTHER PUBLICATIONS

Keigler et al., "Enabling 3-D Design", *Semiconductor International*, p. 36-44, Aug. 2007.

Gian et al., "High aspect pattern formation by integration of micro inkjetting and electroless plating," *DTIP of MEMS & MOEMS*, 6 pages, Apr. 2008.

Kawase et al., "Inkjet printed via-hole interconnections and resistors for all-polymer transistor circuits," *Advanced Materials*, vol. 13, No. 21, pp. 1601-1605, Nov. 2, 2001.

Lok et al., "Process integration of inkjet printing and electroless plating for LTCC substrates," *IEEE*, 9th Electronics Packaging Technology Conference, pp. 202-205, 2007.

Sirringhaus et al., "High-resolution inkjet printing of all-polymer transistor circuits," *Science: American Association for the Advancement of Science (AAAS)*, vol. 290, No. pp. 2123-2126, Dec. 15, 2000. (Downloaded from www.sciencemag.org on Aug. 27, 2008.).

* cited by examiner

FILLING DEEP FEATURES WITH CONDUCTORS IN SEMICONDUCTOR MANUFACTURING

FIELD

The present invention generally relates to semiconductor integrated circuit technology and, more particularly, to a process for filling features.

BACKGROUND

Conventional semiconductor devices or integrated circuits (ICs) generally include a semiconductor substrate, usually a silicon substrate, and a plurality of sequentially formed dielectric layers and conductive paths or interconnects made of conductive materials. IC interconnects are usually formed by filling a conductive material such as copper into features (openings) formed in the dielectric layers. Such features include, but are not limited to, vias, cavities, and trenches that are filled to define lines, pads and contacts. In a typical integrated circuit, multiple levels of interconnect networks laterally extend with respect to the substrate surface. Interconnects formed in different layers can be electrically connected using vias filled with contacts.

Recently, work has been carried out to develop high-density, low-capacitance vertical interconnect technologies for integrated circuit systems. These wafer level integration and packaging technologies are aimed at increasing IC system performance in terms of speed and reduced power consumption while reducing weight and volume. The vertical interconnects enable three dimensional (3-D) homogeneous integration of multiple layers of ICs as well as 3-D heterogeneous integration of multiple layers of ICs with various devices fabricated in different materials. Thus, 3-D integration includes integrating multiple ICs either at the chip or wafer level. The resulting multi-layer structures offer optimal short interconnect paths and large inter-layer signal bandwidth compared to the existing wire bonding technologies with high inductance, low speed, low wiring density and high cross talk.

3-D interconnect structures comprise larger features in terms of depths and widths, compared to the standard IC interconnect structures. Standard IC interconnect structures include sub-micron width vias and trenches at lower metal layers and may also have 50-100 micrometers ($\mu$m) wide lines and bond-pads, especially at the highest metal layers. Feature depth may range from 0.15-0.6 $\mu$m for lower metal levels and it may be in the range of 1-5 $\mu$m at the higher metal levels of typical IC interconnects. The aspect ratio (depth-to-width ratio) of small or narrow features in an IC interconnect is typically 2 or higher, whereas the aspect ratio of the larger features (e.g., wider than about 3 $\mu$m in the above example) are smaller than 1, typically smaller than 0.1 for lower metal layers such as M1 and M2, the lowest two levels of metal in an integrated circuit. In comparison, 3-D integration structures are much deeper. Although their widths are large, their aspect ratios are also larger than 1. In other words, the features have depths larger than their widths. These structures typically include vias with diameters or widths of 10-100 $\mu$m and aspect ratios of more than 5, even higher than 10. Therefore, processes applicable to filling the narrow features of IC interconnects with a metal do not necessarily apply to filling the wider and deeper, i.e., larger, features of 3-D interconnects.

The most commonly used processing approach for filling a conductor into IC interconnect damascene vias or trenches is electrochemical deposition or electroplating. Electroplating techniques are relatively low cost. In addition, they have the capability of filling narrow and high aspect ratio features in a bottom-up fashion so that voids and other defects do not form in the features. In an electroplating process, a conductive material such as copper is deposited to fill such features. The material is then annealed for grain growth. Then, a material removal technique, such as chemical mechanical polishing (CMP), is employed to planarize and remove the excess metal or overburden from the top surface of the wafer, leaving conductive material only in the features. It should be noted that for IC interconnect formation it is beneficial to deposit some overburden thickness onto the top surface or field regions of the wafer surface. Such overburden helps grain growth within the small features and helps reduce resistance of copper within the features.

3-D integration using the IC interconnect approaches described above are challenging. First of all, deposition of continuous and uniform barrier and copper seed layers on the internal surfaces of the extremely deep vias is very difficult, if not impossible, especially for via depths of 50 $\mu$m or more.

FIGS. 1A, 1B, 2A and 2B show exemplary vias of a 3-D integration structure. In FIG. 1A, a barrier layer (not shown) and a seed layer 11 are deposited on an internal surface of a via 1 and field regions 2. Then, copper is electroplated onto surfaces of the seed layer 11 in the via 1 and the field regions 2, as shown in FIG. 1B. Electroplated copper portion 14 is shown as cross-hatched in FIG. 1B. As shown in FIG. 1A, the seed layer 11 has discontinuities 12 and 13 on its sidewalls because continuous and uniform barrier and copper seed layers on the internal surfaces of the extremely deep via 1 is very difficult. The discontinuities 12 and 13 of the seed layer 11 yield voids 15 during electroplating, as shown in FIG. 1B, since electroplating of copper requires good quality copper seed layers on which copper can grow. The void 15 would deteriorate the electrical properties as well as the reliability of the 3-D via.

To avoid the void 15, the seed layer thickness may be increased to make it more continuous within the via. Then, a situation shown in FIG. 2A arises, where excess thickness at the top surface causes narrowing of the via entrance due to copper overhang 16. With reference to FIG. 2B, upon plating copper on and into the structure of FIG. 2A, a center void 17 occurs due to premature closing of the via entrance during plating. The center void 17 of FIG. 2B which may be filled with the plating electrolyte deteriorates the reliability and electrical properties of a resulting 3-D structures, just as the void 15 of FIG. 1B does. Other problems associated with the use of electroplating techniques for 3-D integration include low throughput, since the features to be filled are extremely large and the plating current densities are limited to a range that does not cause voiding in the vias. Such current density range is typically about 2-20 mA/cm$^2$.

Therefore, there is a need for development of new approaches that fills the large features, such as those of 3-D integration structures, with a conductive material such as copper in a cost effective manner without voids and other defects within the features.

SUMMARY

According to one aspect of the invention, a method of filling a conductive material into a feature formed on a surface of a workpiece is disclosed. The method is used for filling a conductive material into a feature having a width of at least 5 micrometers and a depth of at least twice the width. The method comprises filling an ink comprising copper particles into the feature. The ink is dried so that the copper particles remain in the feature. The copper particles are annealed in the feature to form a copper structure in the feature.

According to another aspect of the invention, a method of filling a conductive material in an opening formed in a surface of a wafer is disclosed. The method comprises filling the opening with a dispersion comprising a plurality of nanoparticles and a liquid. The liquid is removed from the opening, leaving the plurality of nanoparticles in the opening. The nanoparticles are fused in the opening to form a conductive plug.

For purposes of summarizing the invention and the advantages achieved over the prior art, certain objects and advantages of the invention have been described above and as further described below. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figure, the invention not being limited to any particular preferred embodiment(s) disclosed.

DETAILED DESCRIPTION

Figure 1A:
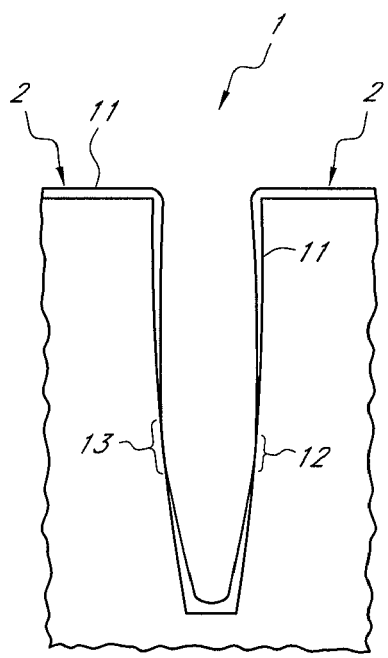
FIG. 1A is a schematic cross-sectional illustration of a substrate including a 3-D integration structure feature having a thin seed layer, where the feature is to be filled with a conductive material according to a conventional electroplating method.
Figure 1B:
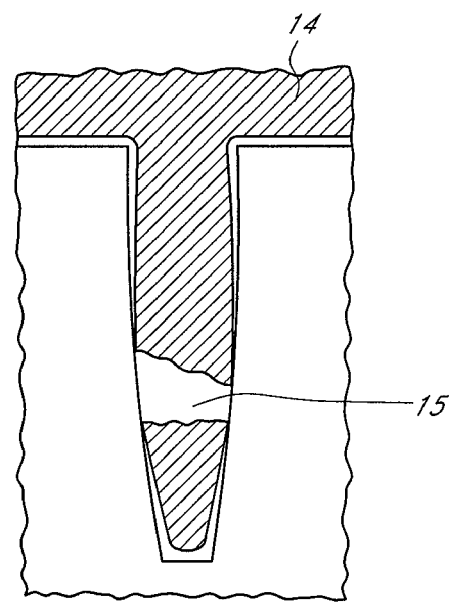
FIG. 1B is a schematic cross-sectional illustration of the substrate of FIG. 1A following electroplating of a conductor.
Figure 2A:
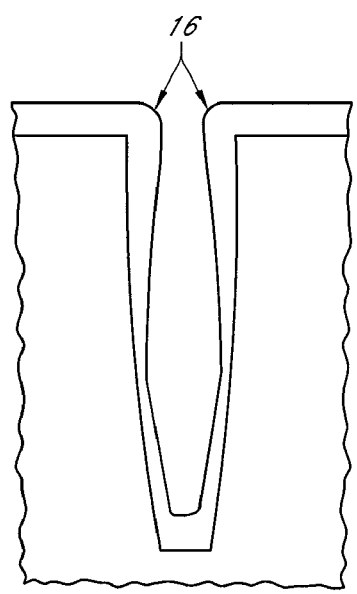
FIG. 2A is a schematic cross-sectional illustration of a substrate including a 3-D integration structure feature to be filled with a conductive material having a thicker seed layer than FIG. 1A.
Figure 2B:
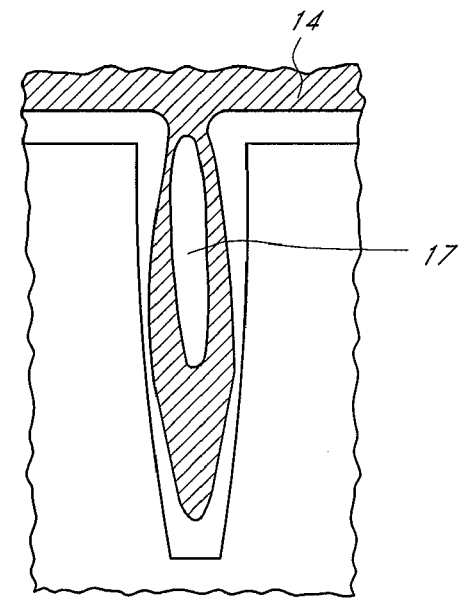
FIG. 2B is a schematic cross-sectional illustration of the substrate of FIG. 2A following electroplating of a conductor.

The preferred embodiments of the present invention provide dispersion or ink deposition processes for defect-free filling of a feature (cavity or opening) formed on a surface of substrate. Preferably, the dispersion process is used to fill a feature having a large width and depth. The process may include at least two steps: a deposition step that fills a dispersion containing conductive particles into a feature; and an annealing step that fuses the conductive particles to form a conductive plug within the feature.

In one embodiment, the process deposits or fills a conductive material into a feature with a width of at least 5 μm, preferably at least 10 μm. The feature may have an aspect ratio of at least 2. In other words, the feature has a depth of at least twice the width of the feature. In certain embodiments, the aspect ratios may be more than 5, even higher than 10. The term, "aspect ratio," as used herein, refers to a depth-to-width ratio. The deposition step and the annealing step will now be described in detail.

Deposition Step

First, a composition containing conductive particles is prepared. The composition may also be referred to as a dispersion or an ink. Exemplary materials for the conductive particles are copper (Cu), copper alloys, or other conductive materials that may improve reliability of the conductive elements being formed, particularly for 3-D interconnect structures. Other examples of materials for the conductive particles include, but are not limited to, silver (Ag), nickel (Ni), gold (Au), and aluminum (Al). In certain embodiments, mixtures, alloys, or oxides of the foregoing materials may be used for the conductive particles. In the case of oxides, the particles may be non-conductive and later converted to a conductive material, as will be appreciated in view of the disclosure hereinbelow. The illustrated embodiment is suited to form conductive plugs including mixtures or alloys of conductive materials. Such conductive plugs can easily be formed by controlling the composition(s) of the particles in the dispersion. For example, by mixing controlled ratios of copper particles with silver particles within the dispersion, Cu—Ag conductive plugs may be obtained. Alternatively, particles formed of a material including both Cu and Ag (such as Cu—Ag alloys) may be used to form Cu—Ag conductive plugs.

In one embodiment, a dispersion or an ink containing Cu is prepared. The dispersion contains nano-size particles of Cu. The Cu particles are suspended and dispersed in a solution. The particles may have an average diameter between about 1 nm and about 500 nm, preferably between about 5 nm and about 100 nm. In the illustrated embodiment, the deposition step is conducted for features that are wider than 5 μm, such that the size of the particles is not limited by the size of the opening of the features. Rather, it is dictated by the ability to obtain a uniform and well-applicable dispersion. Usually smaller particle size gives better dispersion and better ink quality. However, it is more difficult and costly to produce smaller nanoparticles. In that respect, use of inks for standard IC integration is problematic since features that are narrower than 70 nm need to be filled in that application and this would only be possible if the particle size were much smaller than 10 nm, preferably smaller than 5 nm. Preparing nanoparticle powders and dispersions or inks with such small particle sizes is not very practical because as the particle size gets smaller, the ratio of surface area ($4\pi R^2$) to bulk volume ($4\pi R^3/3$) of the spherical particles gets larger and larger. In this regime, particles tend to lose their copper-like properties and their characteristics are dominated more by their surface. Accordingly, it is preferred to employ larger than or equal to 5 nm size particles.

The copper particles for use in the dispersion may be obtained by various methods. Examples of such methods include, but are not limited to, evaporation or sputtering of copper into an inert gas such as Ar or He at pressures of $10^{-3}$ to 800 Torr. Various atomization or spray approaches may also be utilized.

In one embodiment, the dispersion may be prepared by adding the copper particles obtained as above into a liquid carrier. Examples of the liquid carrier include, but are not limited to, water, alcohol, and other organic solvents such as ethylene glycol or glycerol. Additives such as surfactants and/or dispersion agents may be then added to the dispersion. The dispersion may include various surfactants and dispersing agents (cationic, anionic or neutral) commercially available, e.g., from Rohm and Haas of Philadelphia, Pa. Polyvinylpyrrolidone (PVP) is a material that may be used as an additive that helps dispersion of the particles in the dispersion. The copper particles may be in an amount between about 5 wt % and about 50 wt %, preferably between about 20 wt % and about 30 wt % of the dispersion. Then, agitation is provided, preferably through sonic vibration or sonication for the copper particles to form a stable dispersion. The viscosity of the dispersion is adjusted (by selection of particle size, carrier and percentage of nanoparticles in the dispersion) so that the dispersion flows and fills the features characteristic of 3-D structures once applied to a wafer surface.

After the dispersion is prepared, it is deposited on a wafer surface including 3-D integration structure features such as cavities, vias, or trenches. Various approaches such as spraying, spinning, dipping, etc. may be used for application. One preferred method involves delivery of the dispersion on the wafer surface followed by spinning to get rid of excess dispersion on field regions of the wafer surface. Alternatively, the dispersion may be delivered to the whole wafer surface, and then a sweeper may sweep excess dispersion from the field regions, leaving it mainly in the cavities. It should be noted that the embodiments of the invention do not require a continuous copper seed layer on the inner walls of the 3-D structure features since it does not involve electroplating. In the illustrated embodiment, no copper seed layer is necessary provided that wetting of the via walls by the dispersion is adequate. Since the dispersion preferably contains surfactants in their formulation, once the dispersion is delivered to the wafer surface, it is pulled into the features due to the strong surface tension and fills them without any voids and defects. There are also other methods of improving void-free gap fill by the dispersion as will be described below.

Figures 3A, 3B:
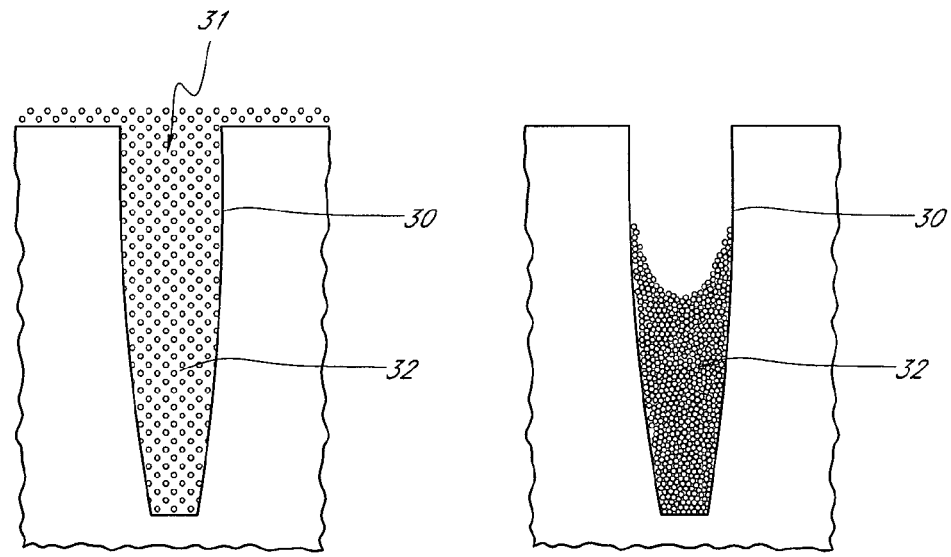
FIGS. 3A-3D are schematic cross-sectional illustrations of a method of filling 3-D integration structure features with conductive particles according to one embodiment of the invention.
Figures 3C, 3D:
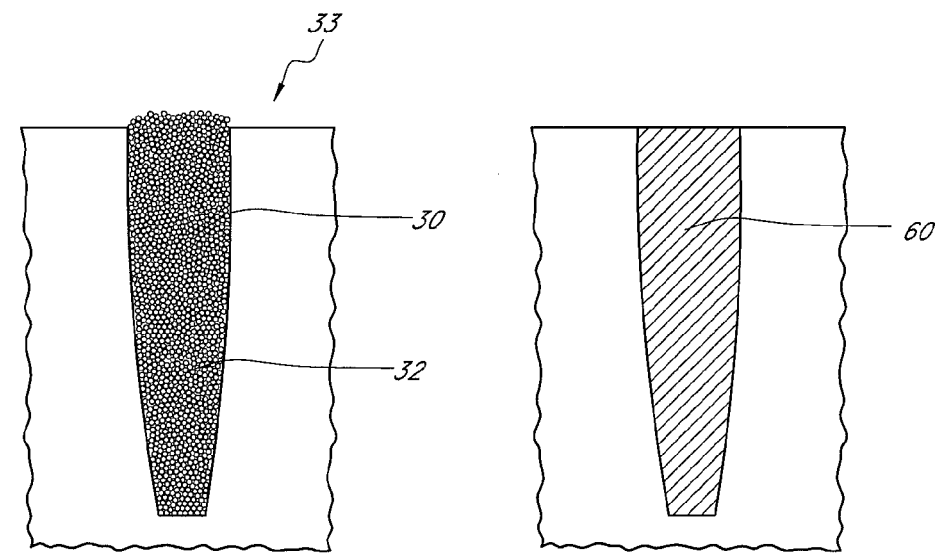

Since the weight percent of copper in the dispersion is less than 100%, the dispersion may be applied more than once onto the surface of the wafer to completely fill the features with the copper particles. FIG. 3A depicts a 3-D integration via 30 filled with a dispersion 31 containing copper particles 32 after a first application of the dispersion 31 into the via 30. After the first application of the dispersion 31, a drying step is performed to remove the solvent or liquid in the via 30. The drying step may be conducted at a temperature between about 30° C. and about 100° C. in air, vacuum or inert gas. After the drying step, copper particles 32 settle down and partially fill the via 30, as shown in FIG. 3B. Subsequent application or applications of the dispersion followed by drying step(s) in a cyclical process eventually results in complete filling of the via 30 with copper particles 32, as shown in FIG. 3C. In the illustrated embodiment, no copper is shown on the top surface or field regions 33 in FIG. 3C. While, there may actually be some copper particles remaining on the top surface 33, preferably substantially all of the copper particles are within the vias 30 or other features. Preferably 2 to 4 cycles can be performed, depending on the size of a feature to be filled, the size of nanoparticles and the weight ratio of nanoparticles 32 in the dispersion 31. There may also be annealing (see next section) performed between or part of the deposition cycles.

Annealing Step

After the deposition step(s), the feature(s) filled with copper particles is subjected to an annealing or densification step at which the copper particles are fused together, thereby forming a substantially dense copper plug 60, as shown. It should be noted that the density of the copper plug may be controlled by choosing the shape and size of the particles in the dispersion. While spherical particles or flat particles in the form of plates may yield high density, particles with random shapes and forms yield lower density. Mixing relatively large particles with small ones in the dispersion may also increase the density since small particles can fill the gaps between large ones. Control of density of the plug may be important to minimize stress caused by the plug on the 3-D structures. Specifically, a plug with micro-porosity may be obtained by the present technique and such a plug, although highly conductive, may induce less stress on the 3-D integration structures. The annealing step may include a heat treatment preferably at a temperature of between about 200° C. and about 500° C., more preferably between about 300° C. and 400° C. Examples of heat treatment include, but are not limited to, furnace annealing, laser annealing, and rapid thermal annealing (RTA). The atmosphere during the annealing step may be an inert atmosphere (Ar, He, $N_2$, etc), a reducing atmosphere ($H_2$, CO, alcohol vapor etc.), or vacuum.

In the illustrated embodiment, copper is used as an exemplary material to form the dispersion. In other embodiments, the dispersion may include alloys or compounds of copper. In one embodiment, instead of copper particles, metal oxide particles, such as copper oxide, may be used in the formulation of a dispersion. In such an embodiment, the annealing step may be carried out in a reducing atmosphere at reduced pressure, atmospheric pressure or above atmospheric pressure to reduce the oxide into pure copper. Such an embodiment can be advantageous because oxide reduction is an exothermic process and releases heat helping local fusing between the particles, thereby yielding a dense copper plug. In another embodiment, a mixture of copper and copper-oxide particles may also be used in the dispersion.

Figure 4:
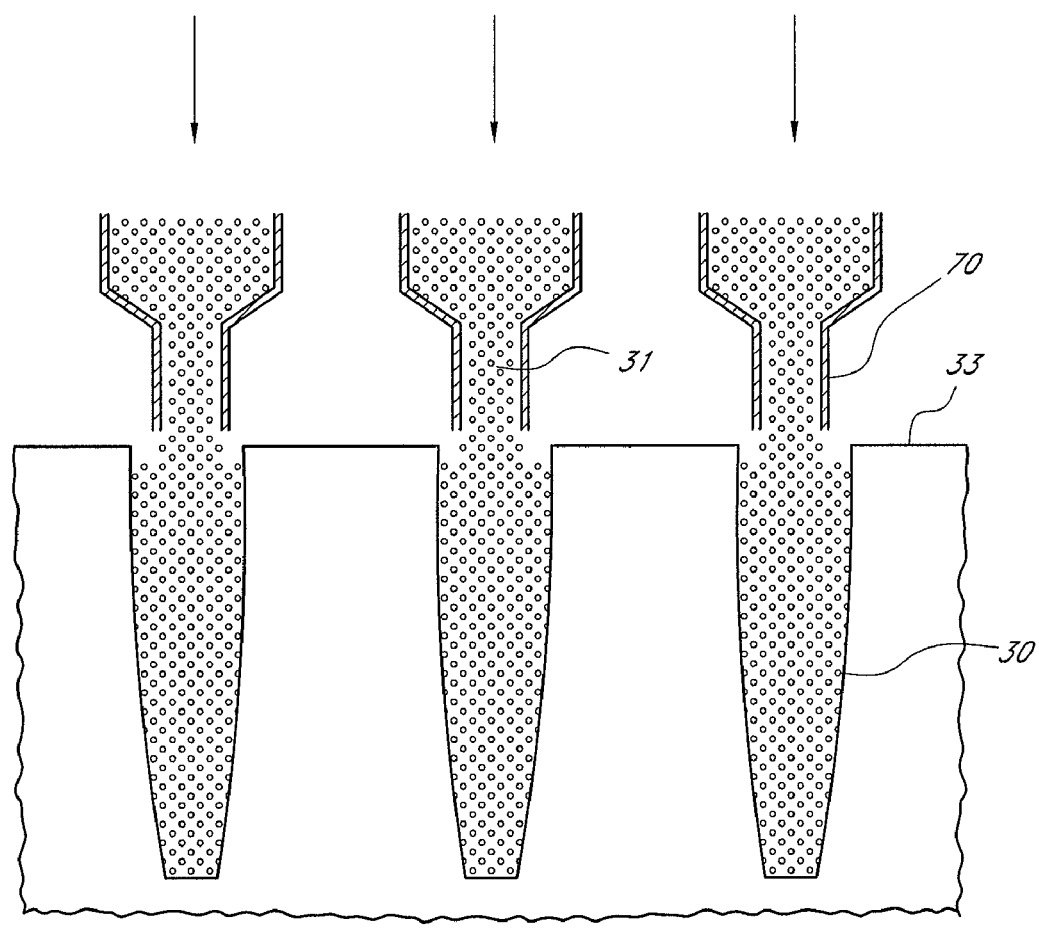
FIG. 4 is a schematic cross-sectional illustration of a method of filling features with conductive particles according to another embodiment of the invention.

FIG. 4 illustrates a method of filling cavities on a wafer with a conductive material according to another embodiment. Preferably, the illustrated embodiment applies to filling particularly large features, such as for forming 3-D integration structures. The features preferably have a width of at least about 20 μm and a depth of at least about 50 μm. Since the features of the 3-D structures are large, it is possible to deliver a dispersion directly into 3-D features instead of delivering to the whole surface of the wafer. In FIG. 4, micro-nozzles 70 are used to inject the dispersion 31 into vias 30 without delivering the dispersion to a top surface or field regions 33 of the wafer. Each of the micro-nozzles 70 are aligned over a respective one of the vias 30. Then, the dispersion 31 is injected into the vias 30. A skilled artisan will appreciate that various apparatuses and methods may be used to directly fill such large features with the dispersion containing conductive particles. This configuration improves materials utilization and increases throughput. In addition, it assures that the features are filled with the dispersion without causing any voids.

Electronic Devices

Another aspect of the invention provides an electronic device including an electronic circuit having an interconnect made by the method described above. The electronic device may include, but is not limited to consumer electronic products, electronic circuits, electronic circuit components, parts of the consumer electronic products, electronic test equipments, etc. The consumer electronic products may include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device may include unfinished intermediate products.

Although various preferred embodiments and the best mode have been described in detail above, those skilled in the art will readily appreciate that many modifications of the exemplary embodiment are possible without materially departing from the novel teachings and advantages of this invention.

I claim:

1. A method of filling a conductive material into a feature formed on a surface of a workpiece, the method comprising:
    aligning a micro-nozzle over a feature having a width of about 10µm to about 100 µm and a depth of more than five times the width, the feature forming part of a three-dimensional interconnect structure for an integrated circuit;
    filling an ink comprising copper particles and a surfactant into the feature, using the micro-nozzle;
    drying the ink so that the copper particles remain in the feature; and
    annealing the copper particles in the feature to form a copper structure in the feature.

2. The method of claim 1, further comprising repeating filling and drying at least one more time before annealing.

3. The method of claim 1, wherein drying results in partially filling the feature with particles.

4. The method of claim 3, further comprising repeating filling and drying until the feature is filled with particles before annealing.

5. The method of claim 1, wherein drying results in completely filling the feature with particles.

6. The method of claim 1, wherein the feature comprises a three-dimensional integration structure feature.

7. A method of filling a conductive material in an opening formed in a surface of a wafer, the method comprising:
    using a micro-nozzle to inject a dispersion directly into an opening, the opening forming part of a three-dimensional interconnect structure for connection of integrated circuits, the opening having a width of at least about 5 µm and an aspect ratio of about 2 or greater, the dispersion comprising a plurality of nanoparticles and a liquid;
    removing the liquid from the opening, leaving the plurality of nanoparticles in the opening; and
    fusing the nanoparticles in the opening.

8. The method of claim 7, further comprising repeating the steps of injecting the dispersion and removing the liquid at least one more time prior to fusing.

9. The method of claim 7, wherein the opening has a width of at least about 5µm.

10. The method of claim 9, wherein the opening has a width of at least about 10 µm.

11. The method of claim 7, wherein the plurality of nanoparticles have an average diameter between about 5 and about 100 nm.

12. The method of claim 7, wherein the plurality of nanoparticles comprise one or more materials selected from the group consisting of Cu, Ag, Ni, Au, Cu-Ag, Al, their oxides, and their alloys.

13. The method of claim 7, wherein the liquid comprises one or more liquids selected from the group consisting of water, alcohol, ethylene glycol, and glycerol.

14. The method of claim 7, wherein the plurality of nanoparticles represent about 5 wt% to about 50 wt% of the dispersion.

15. The method of claim 14, wherein the plurality of nanoparticles represent about 20 wt% to about 30 wt% of the dispersion.

16. The method of claim 7, wherein the dispersion further comprises a surfactant.

17. The method of claim 7, wherein removing the liquid comprises heating the wafer to a temperature between about 30° C. and about 100° C.

18. The method of claim 7, wherein fusing the nanoparticles comprises heating the wafer to a temperature between about 200° C. and about 500° C.

19. The method of claim 7, wherein the plurality of nanoparticles comprise copper oxide and wherein fusing the nanoparticles comprises annealing in a reducing atmosphere.

20. The method of claim 7, wherein the opening has a width of at least about 20 µm and a depth of at least about 50 µm.

21. The method of claim 1, wherein filling the ink comprises filling the ink directly into the feature while providing substantially no ink on the surface of the workpiece.

* * * * *